(12) United States Patent
Chen

(10) Patent No.: US 7,800,231 B2
(45) Date of Patent: Sep. 21, 2010

(54) BALL GRID ARRAY PACKAGE AND SUBSTRATE WITHIN

(75) Inventor: Yun-Han Chen, Hsinchu (TW)

(73) Assignee: Via Technologies, Inc., Hsin Tien, Taipei Hsien (TW)

( * ) Notice: Subject to any disclaimer, the term of this patent is extended or adjusted under 35 U.S.C. 154(b) by 417 days.

(21) Appl. No.: 11/453,804

(22) Filed: Jun. 16, 2006

(65) Prior Publication Data
US 2007/0018319 A1   Jan. 25, 2007

(30) Foreign Application Priority Data
Jul. 22, 2005   (TW) .............................. 94125028 A

(51) Int. Cl.
*H01L 21/00* (2006.01)
(52) U.S. Cl. .................. 257/773; 257/698; 257/700; 257/701; 361/306.1
(58) Field of Classification Search ................ 257/698, 257/700; 361/306
See application file for complete search history.

(56) References Cited

U.S. PATENT DOCUMENTS

| | | | |
|---|---|---|---|
| 7,035,081 B2* | 4/2006 | Nagata et al. | 361/306.3 |
| 2002/0140083 A1* | 10/2002 | Matsuda | 257/711 |
| 2004/0169198 A1* | 9/2004 | Nagata et al. | 257/200 |

* cited by examiner

*Primary Examiner*—Leonardo Andújar
(74) *Attorney, Agent, or Firm*—Thomas, Kayden, Horstemeyer & Risley, LLP

(57) ABSTRACT

A ball grid array (BGA) package includes a substrate and a chip. A bottom surface of the substrate includes a central area and a marginal area. Several source balls are disposed in the central area. Several ball groups are disposed in the marginal area. Each ball group includes one ground ball and at most three signal balls. The chip is disposed on a top surface of the substrate and electrically connected to the substrate.

14 Claims, 5 Drawing Sheets

BALL GRID ARRAY PACKAGE AND SUBSTRATE WITHIN

BACKGROUND OF THE INVENTION (1) Field of the Invention

The present invention generally relates to a ball grid array package (BGA), and particularly to an arrangement of ground connection in a ball grid array package.

(2) Description of the Prior Art

A ball grid array package (BGA) is a technology used for packing a semiconductor chip. The packing efficiency of the ball grid array package is very high. Therefore, with the trend of electronic components and devices becoming smaller and smaller, the ball grid array package with high packing efficiency and yield rate is used generally.

Please refer to FIG. 1. A typical ball grid array package 10 is illustrated in FIG. 1. The package 10 usually includes a semiconductor ship 11. The chip 11 is disposed on a top surface of a substrate 12 and is electrically connected to the substrate 12. Also, the chip 11 is usually adhered on the top surface (chip adhering surface) of the substrate 12 by an adhesive.

As shown in FIG. 1, several electrically conductive wires 13 are used for electrically connecting the chip 11 and the substrate 12. An encapsulating material 15 covers the chip 11 and a portion of the substrate 12, for avoiding the chip 11 and the portion of the substrate 12 from moisture and pollution. The substrate 12 is usually a multi-layer structure. For example, the substrate 12 can have two signal layers, one ground layer and one power layer. The ground layer and the power layer are disposed between the two signal layers.

Several solder balls 14 are disposed on a bottom surface of the substrate 12, so that an outer circuit or another electronic apparatus is able to easily electrically connect to the chip 11 through the package 10. The solder balls 14 can be sorted as source balls, signal balls or ground balls according to the circuit that the solder balls 13 are electrically connected to. The source balls are used for supplying power. The signal balls are used for transmitting signals. And the ground balls are used for proving a reference electric potential.

Along with the trend of the electronic components and devices becoming smaller and smaller, the operation speed thereof is promoted as well. Also, the circuit integration of the electronic components and devices increases. In the condition of high operation speed, signals are not transmitted according to preset circuits more frequently. As a result, noise occurs and even the chip sometimes does not function normally. Therefore, in the condition of high operation speed, it is very important to control the impedance between the signals, reduce the electromagnetic interference (EMI), decrease the interference between the signals and suppress coupling effect of noise.

Generally speaking, the transmission of the signal is completed when the an induced return current is transmitted to the nearest ground terminal. In a prior art, several (usually more than eight) signal balls refer to a ground ball in common. As a result, the signal transmitted to the ground ball sometimes needs to wait or find the reference electric potential of another ground ball. When the operation speed is promoted or when the circuit integration is increased, noise occurs more frequently. Also, the chip does not function normally more frequently.

SUMMARY OF THE INVENTION

A ball grid array package is provided by the present invention. The package includes a substrate and a chip. A bottom surface of the substrate includes a central area and a marginal area. Several source balls are disposed in the central area. Several ball groups are disposed in the marginal area. Each ball group includes one ground ball and at most three signal balls. The chip is disposed on a top surface of the substrate and electrically connected to the substrate.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
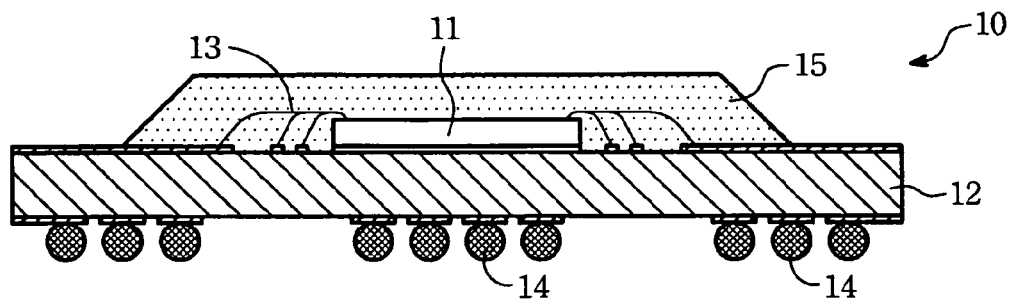
FIG. 1 illustrates a typical ball grid array package.
Figure 2:
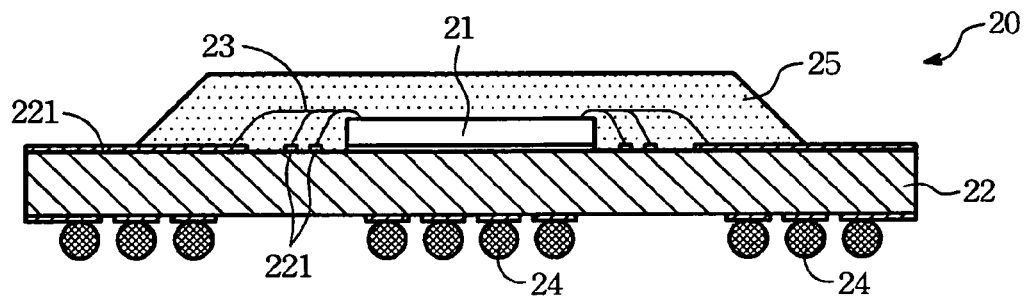
FIG. 2 is a cross-sectional side view of a ball grid array package according to the invention.

Please refer to FIG. 2. A cross-sectional side view of a ball grid array (BGA) package 20 according to the invention is illustrated in FIG. 2. The package 20 can includes a semiconductor chip 21. The chip 21 is disposed on a surface of a substrate 22, such as a top surface of the substrate 22 as shown in FIG. 2. The chip 21 is electrically connected to the substrate 22. Practically, the chip 21 is adhered on the top surface (a chip adhering surface) of the substrate 22 by an adhesive.

The substrate 22 can be a multi-layer structure. For example, the substrate 22 can be a four-layer structure including an upper signal layer, a lower signal layer, a ground layer and a power layer. The ground layer and the power layer are disposed between the upper signal layer and the lower signal layer. Several bonding pads 221 are disposed on the top surface of the substrate 22, as shown in FIG. 2. Several electrically conductive wires 23 are used for connecting the bonding pads 221 and the chip 21, for electrically connecting the bonding pads 221 and the chip 21.

An encapsulating material 25 is used for covering the chip 21 on the top surface of the substrate 22, so that the chip 21 is not invaded by moisture or polluted by other particles.

The substrate 22 has a bottom surface corresponding to the top surface. Several metal balls 24 are disposed on the bottom surface of the substrate 22. For example, the metal balls 24 are solder balls. The metal balls 24 are used for electrically connecting an outer circuit or another electronic apparatus to the chip 21 through the package 20. When the package with the chip 21 as the main body of the package is connected to an outer electronic apparatus, the metal balls 24 are reflowed to combine the package 20 with a mounting board (not shown in FIG. 2). As a result, the package 20 is electrically connected to the mounting board.

The metal balls 24 can be sorted as source balls 24$v$, signal balls 24$s$ and ground balls 24$g$ (shown in FIG. 3) according to the circuits which they are electrically connected to. The source balls 24$v$ are used for providing power. The signal balls 24$s$ are used for transmitting signals. The ground balls 24$g$ are used for providing a reference electric potential to be a terminal of a signal circuit.

Figure 3:
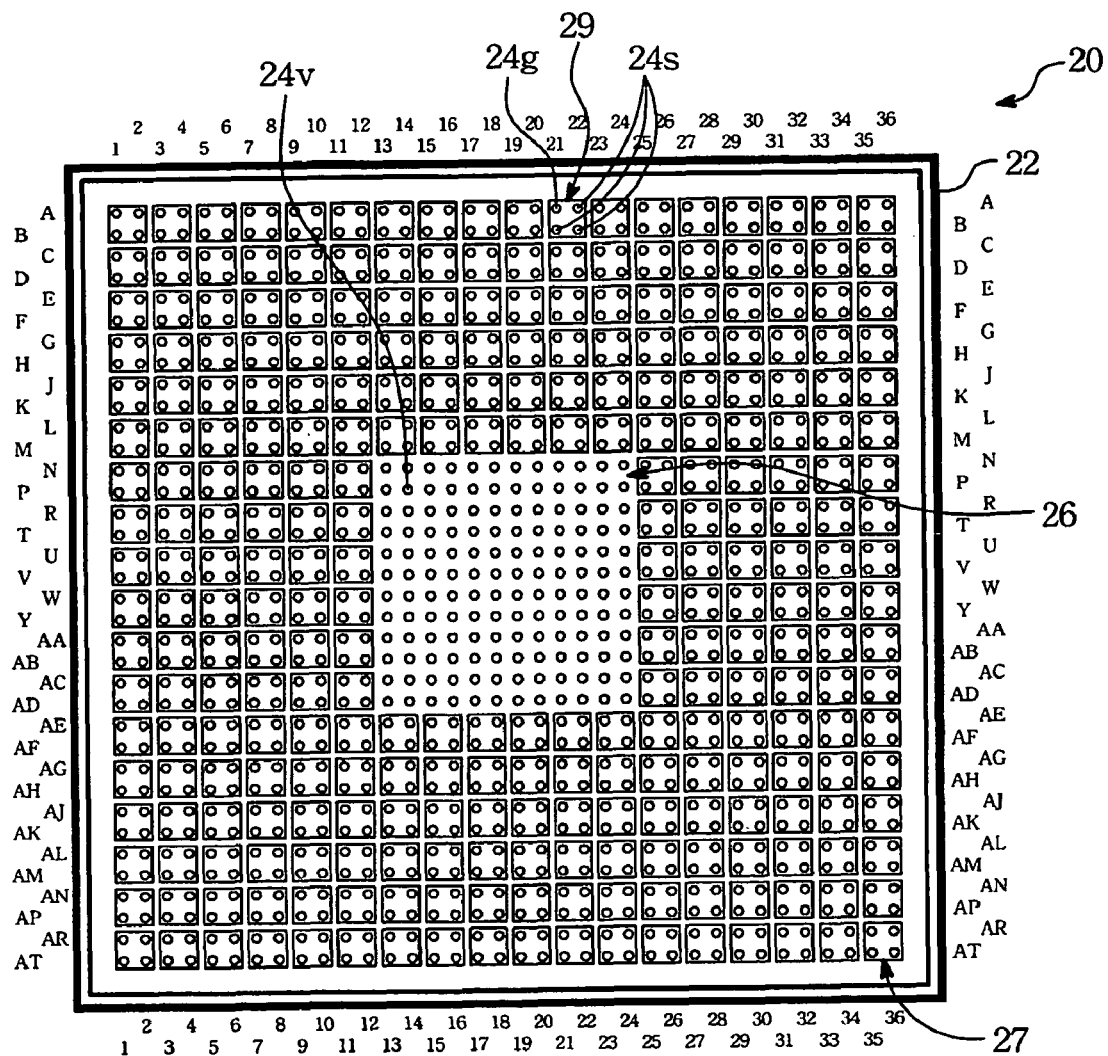
FIG. 3 is a bottom view of the package shown in FIG. 2.

Please refer to FIG. 3. A bottom view of the package 20 shown in FIG. 2 is illustrated in FIG. 3. The arrangement of the metal ball 24 disposed on the bottom surface of the substrate 22 is shown in FIG. 3. The bottom surface of the substrate 22 includes a central area 26 and a marginal area 27. The marginal area 27 is adjacent to the central area 26. Several source balls 24v are disposed in the central area 26. Several ball groups 29 are disposed in the marginal area 27. Each ball group 29 has a ground ball 24g and at most three signal balls 24s. Each ball group 29 is arranged in an array in the marginal area 27.

In the embodiment of FIG. 3, each ball group 29 includes one ground ball 24g and three signal ball 24s. The ground ball 24g and the three signal balls 24s are arranged as a rectangle. As a result, when the chip 21 on the top surface of the substrate 22 (as shown in FIG. 2) operates, the problem that the same ground ball 24g is used by different signal circuits (the signal ball 24s→the chip 21→the ground ball 24g) occurs less frequently in the present embodiment than in the prior art. Even in the condition of high operation speed, the interference between the signals and the coupling effect of the noise are controlled effectively in the embodiment of the invention. As proved in an experiment, the impedance control between the signals and the suppression of the electromagnetic interference (EMI) are promoted obviously in the invention.

Figure 4:
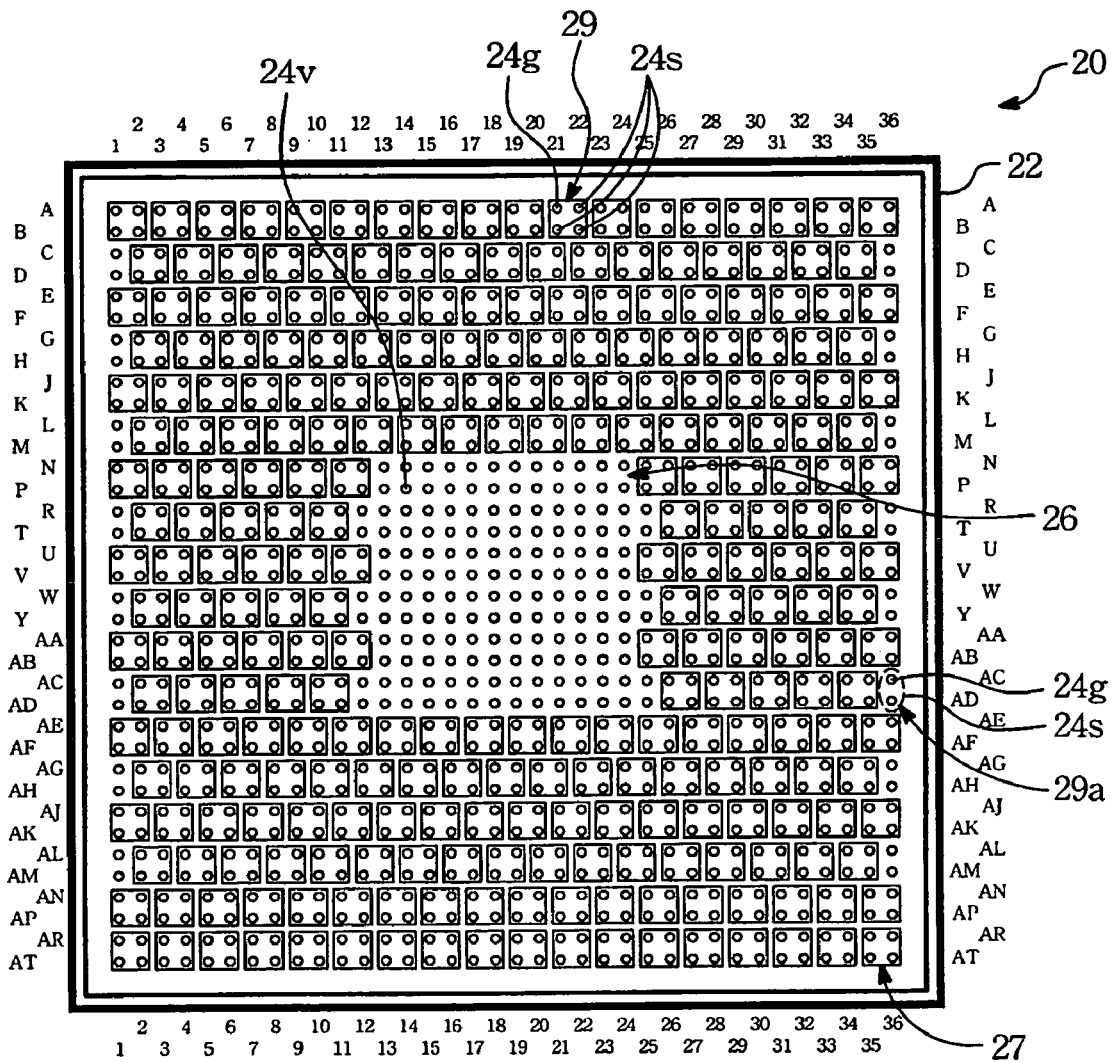
FIG. 4 illustrates another embodiment of the invention.

Please refer to FIG. 4. Another embodiment of the invention is illustrated in FIG. 4. The components and the function of each component in the embodiment of FIG. 4 are substantially the same as those in the embodiment in FIG. 3. Therefore, they are not described repeatedly. Substantially, one ground ball 24g and three signal balls 24s are disposed as a rectangle. However, the ball groups 29 in the present embodiment are arranged a little differently from those in the embodiment of FIG. 3. As shown in FIG. 4, the ball groups 29 in each row are staggered from those in an adjacent row. Also, the ball groups 29 in each column are staggered from those in an adjacent column. The arrangement of the ball groups 29 in FIG. 4 are different from the arrangement of the ball groups in FIG. 3. What is worth mentioning is that the ball group 29a includes only one signal ball 24s and one ground ball 24g. Still, the ball group 29a meets the principle that the ball group in the invention includes one ground ball 24g and at most three signal balls 24s.

Figure 5:
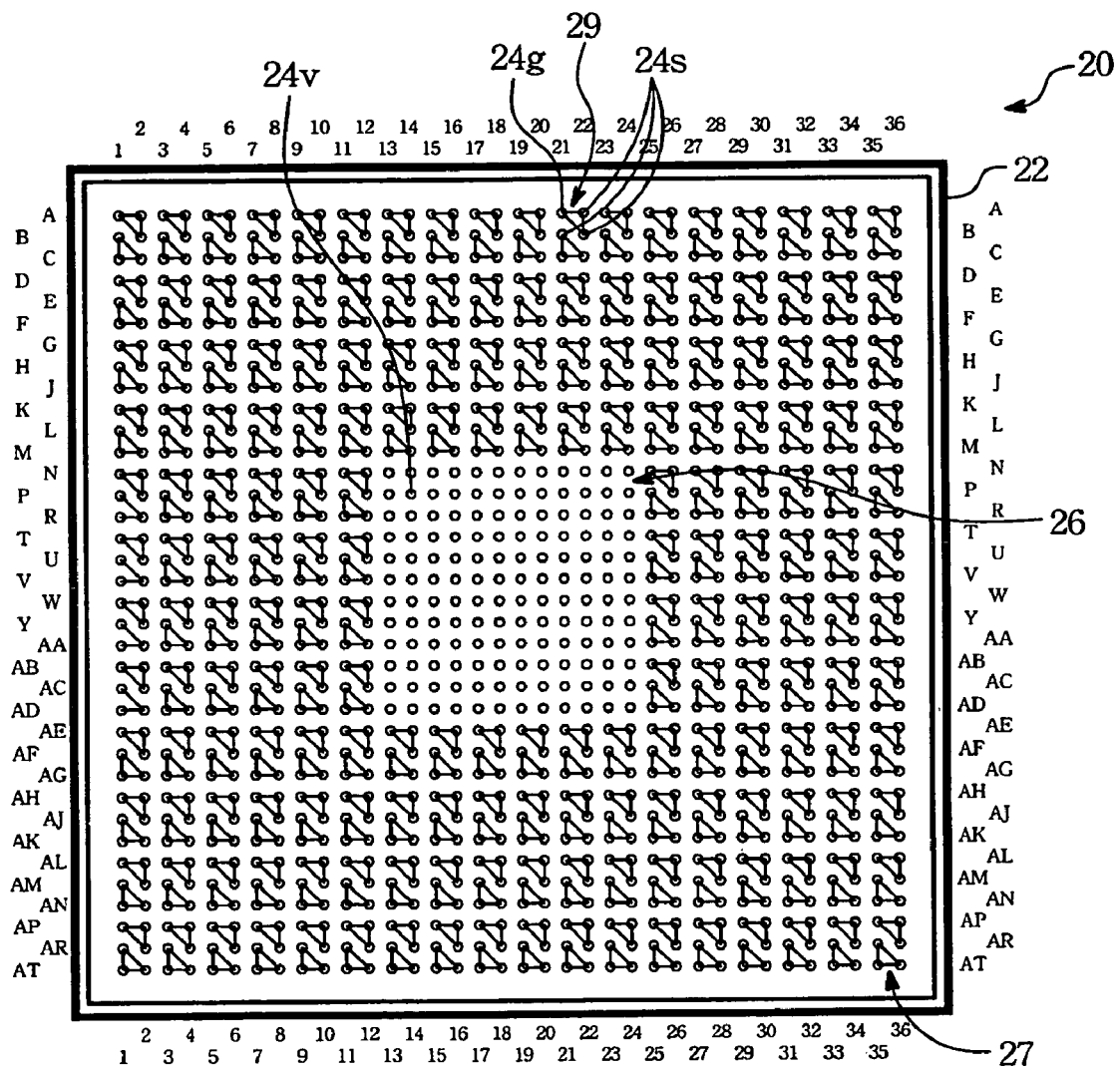
FIG. 5 illustrates another embodiment of the invention.

Please refer to FIG. 5. Another embodiment of the invention is illustrated in FIG. 5. The components and the function of each component in the present embodiment are substantially the same as those in the embodiment of FIG. 3. Therefore, they are not described repeatedly. What is worth mentioning is that each ball group 29 includes one ground ball 24g and two signal balls 24s. One ground ball 24g and two signal balls 24s in the same ball group 29 are arranged as a triangle. The triangular ball groups 29 are disposed in the marginal area 27 on the bottom surface of the substrate 22 as shown in FIG. 5. Also, the triangular ball groups 29 are arranged in an array as shown in FIG. 5.

Figure 6:
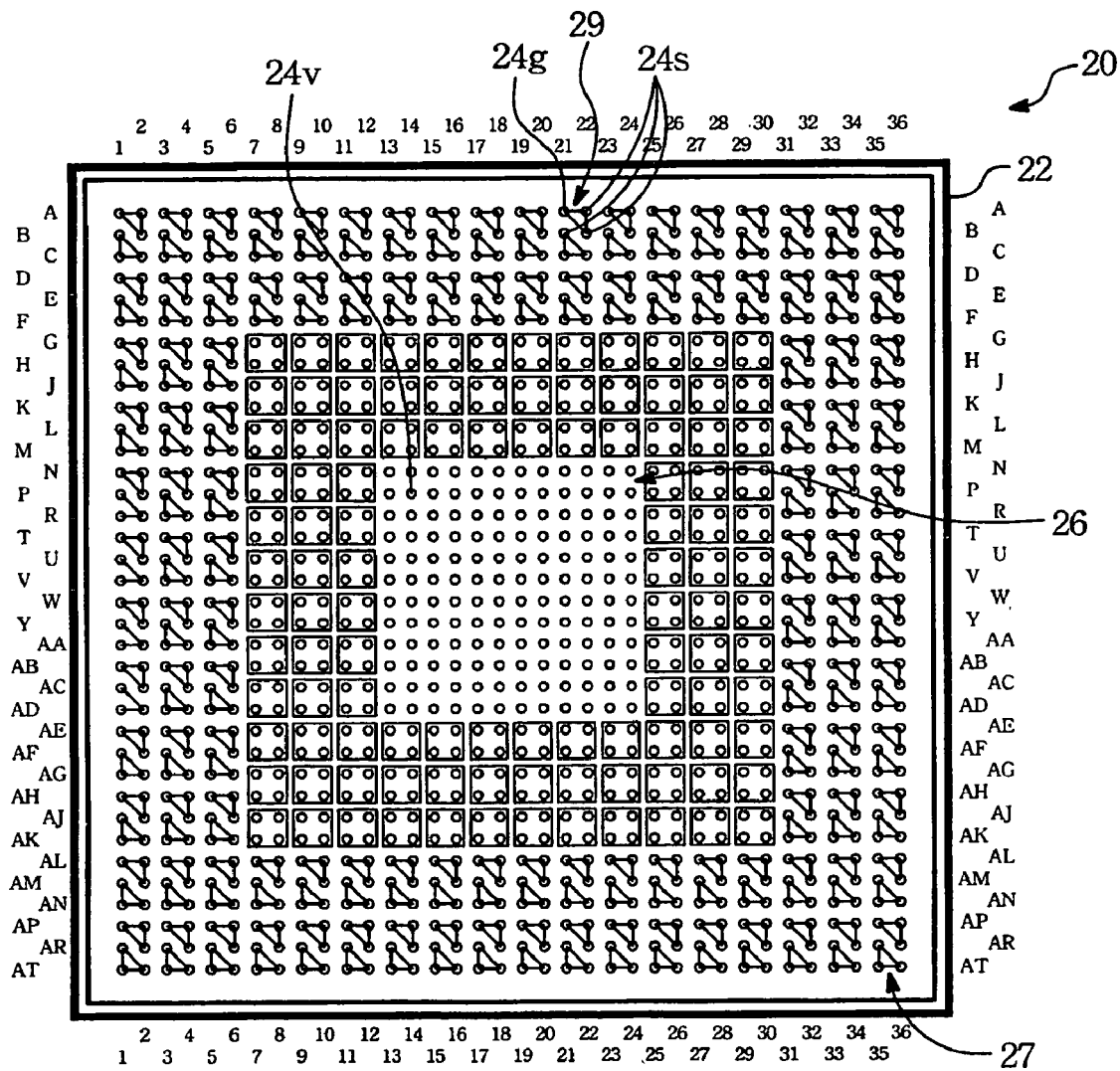
FIG. 6 illustrates another embodiment of the invention.

Please refer to FIG. 6. Another embodiment of the invention is illustrated in FIG. 6. The components and the function of each component in the present embodiment are substantially the same as those in the embodiment of FIG. 3. Therefore, they are not described repeatedly. Some characteristics of FIG. 3 and FIG. 5 are adopted in the present embodiment. Each ball group 29 in an outer part includes one ground ball 24g and two signal balls 24s. Each ball group 29 in an inner part includes one ground ball 24g and three signal balls 24s. The ball groups 29 of the outer part are arranged as triangles, while the ball groups 29 of the inner part are arranged as rectangles.

As stated above, a ball grid array package is provided by the invention. The use of each metal ball is planned in advance for a better ground path. The problem in a prior art that noise or abnormal function caused by insufficient ground balls is alleviated in the present invention. Each ground ball is responsible for less signal circuits. As a result, the liability of the chip in the ball grid array package is improved. The operation speed of the chip is obviously more stable. Furthermore, in the ball grid array package with a chip as the main body of the package, the interference between the signals and the coupling effect of the noise are suppressed and improved obviously in the invention.

With the example and explanations above, the features and spirits of the invention are hopefully well described. Those skilled in the art will readily observe that numerous modifications and alterations of the device may be made while retaining the teaching of the invention. Accordingly, the above disclosure should be construed as limited only by the metes and bounds of the appended claims.

I claim:

1. A ball grid array (BGA) substrate having a top surface for packing a chip thereon and a bottom surface formed with a first array of balls and a second array of balls, no other array of balls formed in between said first array and said second array of balls, wherein said first array of balls is disposed on a central area of said bottom surface, and second array of balls is disposed on a first outer area of said bottom surface, which encloses said central area and said second array of balls is divided into a plurality of ball groups, and each of said ball groups comprises one ground ball and at most three signal balls.

2. The ball grid array substrate of claim 1, wherein said first array of balls includes source balls but no source ball is included in said second array of balls.

3. The ball grid array substrate of claim 1, wherein every ball group consists of one ground ball and three signal balls arranged as a rectangle.

4. The ball grid array substrate of claim 3, wherein all rectangles are arranged tidy in every row direction and in every column direction on said first outer area of said bottom surface.

5. The ball grid array substrate of claim 4, further comprising a third array of balls disposed on a second outer area of said bottom surface, which encloses said first outer area.

6. The ball grid array substrate of claim 5, wherein said third array of balls are grouped for every three adjacent balls consisting of one ground ball and two signal balls.

7. The ball grid array substrate of claim 6, wherein said every three adjacent balls aligned as a right triangle and every two of said right triangles are constituted a pair of triangles and mirrored about a hypotenuse thereof.

8. The ball grid array substrate of claim 3, wherein all rectangles are arranged tidy in every row direction and in every column direction on said first outer area of said bottom surface but all odd rows of said rectangles and all even rows of said rectangles are mutually shifted aligned by a predetermined distance.

9. The ball grid array substrate of claim 1, wherein every ball group consists of one ground ball and two signal balls and arranged as a right triangle and every two of said right triangles are constituted a pair of triangles and mirrored about a hypotenuse thereof 10. A ball grid array (BGA) substrate having a top surface for packing a chip thereon and a bottom surface formed with a first array of balls and a second array of balls, no other array of balls formed in between said first array and said second array of balls, wherein said first array of balls is disposed on a central area of said bottom surface, and second array of balls is disposed on a first outer area enclosing said central area and said second array of balls is grouped for every four adjacent balls consisting of one ground ball and three signal balls.

11. The ball grid array substrate of claim 10, wherein said first array of balls are served as source balls but no source ball is included in said second array of balls.

12. The ball grid array substrate of claim 10, wherein said every four adjacent balls are aligned as a rectangle and all rectangles are arranged tidy in every column and every row on said first outer area.

13. The ball grid array substrate of claim 12 further comprising a third array of balls disposed on a second outer area of said bottom surface, which encloses said first outer area.

14. The ball grid array substrate of claim 10 wherein the ground ball and the three signal balls are shaped as a rectangle.

* * * * *